(12) United States Patent
Matsui et al.

(10) Patent No.: US 7,718,573 B2
(45) Date of Patent: May 18, 2010

(54) METHOD FOR PRODUCING OXIDE SUPERCONDUCTOR, OXIDE SUPERCONDUCTOR AND SUBSTRATE MATERIAL FOR SUPPORTING PRECURSOR OF THE SAME

(75) Inventors: Motohide Matsui, Nagareyama (JP); Masato Murakami, Tokyo (JP)

(73) Assignee: Origin Electric Company, Ltd, Tokyo (JP)

( * ) Notice: Subject to any disclaimer, the term of this patent is extended or adjusted under 35 U.S.C. 154(b) by 888 days.

(21) Appl. No.: 10/543,162

(22) PCT Filed: Jan. 22, 2004

(86) PCT No.: PCT/JP2004/000557
§ 371 (c)(1),
(2), (4) Date: Jul. 21, 2005

(87) PCT Pub. No.: WO2004/065303
PCT Pub. Date: Aug. 5, 2004

(65) Prior Publication Data
US 2006/0116291 A1    Jun. 1, 2006

(30) Foreign Application Priority Data
Jan. 23, 2003   (JP) .............................. 2003-015208

(51) Int. Cl.
*H01L 39/24* (2006.01)
*H01L 39/12* (2006.01)

(52) U.S. Cl. ................. 505/236; 505/237; 505/239; 505/238; 505/124; 505/450; 505/785; 505/927; 428/930

(58) Field of Classification Search ............. 505/236, 505/237, 239, 238, 124, 450, 785, 927; 428/930
See application file for complete search history.

(56) References Cited

U.S. PATENT DOCUMENTS

| | | | | |
|---|---|---|---|---|
| 5,389,604 A | * | 2/1995 | Murakami et al. | 505/450 |
| 5,395,820 A | * | 3/1995 | Murakami et al. | 505/126 |
| 5,430,010 A | * | 7/1995 | Murakami et al. | 505/450 |
| 5,459,124 A | * | 10/1995 | Oyama et al. | 505/450 |
| 5,474,976 A | * | 12/1995 | Kondoh et al. | 505/450 |
| 5,521,150 A | * | 5/1996 | Murakami et al. | 505/450 |
| 5,958,843 A | * | 9/1999 | Sakai et al. | 505/500 |
| 5,968,878 A | * | 10/1999 | Kojo et al. | 505/450 |
| 6,063,736 A | * | 5/2000 | Miryara et al. | 505/126 |
| 6,083,886 A | * | 7/2000 | Hayashi et al. | 505/450 |
| 6,365,553 B1 | * | 4/2002 | Tomita et al. | 505/124 |
| 6,413,624 B1 | * | 7/2002 | Tomita et al. | 428/306.6 |
| 7,001,870 B2 | * | 2/2006 | Iida et al. | 505/126 |

FOREIGN PATENT DOCUMENTS

| | | |
|---|---|---|
| JP | 05-229820 | 7/1993 |
| JP | 09-255335 | 9/1997 |
| JP | 09-306256 | 11/1997 |
| WO | WO 03/002483 A1 * | 1/2003 |

OTHER PUBLICATIONS

Jin et al., "High cirtical currents in Y-Ba-Cu-O superconductors", Appl. Phys. Lett., 52 (24) (Jun. 13, 1988), 2074-2076.*
Lo et al., "Fabrication and characterization of large Nd-Ba-Cu-O grains prepared under low oxygen pressure", J. Mater. Res., 15 (1) (Jan. 2000), 33-39.*
*Joining of melt-textured YBCO: a direct contact method*, Chen et al., Institute of Physics Publishing Superconductor Science and Technology, vol. 15, pp. 672-674, Apr. 2002.
*Processing, microstructure and characterization of artificial joins in top seeded melt grown Y-Ba-Cu-O*, Cardwell et al., Institute of Physics Publishing Superconductor Science and Technology, vol. 15, pp. 639-647, Apr. 2002.
*Project of RE123 Bulk Superconductors Fabrication in a Microgravity Environment*, Sakai et al., Cryogenics, vol. 34, pp. 561-568, Jun. 1999.
Office Action issued on Sep. 8, 2006 on counterpart Chinese Patent Application No. 200480002517.9.
*Powder Metallurgical AgCuO Contact Material*, Qixun, et al., *Powder Metallurgy Research Institute*, pp. 121-124, Jun. 1996.

* cited by examiner

Primary Examiner—Douglas M C Ginty
(74) Attorney, Agent, or Firm—Kolisch Hartwell, P.C.

(57) ABSTRACT

A method for producing an oxide superconductor by partially melting and solidifying the precursor of the oxide superconductor is a method wherein the precursor is placed on a substrate material containing pure metal or a compound which is meltable in the precursor when the precursor is in a partially molten state, and partially melting and solidifying the precursor in said state.

16 Claims, 4 Drawing Sheets

METHOD FOR PRODUCING OXIDE SUPERCONDUCTOR, OXIDE SUPERCONDUCTOR AND SUBSTRATE MATERIAL FOR SUPPORTING PRECURSOR OF THE SAME

TECHNICAL FIELD

The present invention relates to a method for producing an oxide superconductor, an oxide superconductor and a substrate material for supporting the precursor thereof. Furthermore, the present application is claimed on Japanese Patent Application No. 2003-15208, the content of which is incorporated herein by reference.

BACKGROUND ART

When a large, bulk-shaped oxide superconductor having a diameter of several tens of millimeters or more is solidified by slow-cooling from a partially molten state to promote crystal growth, for example, methods like that described below are generally employed. One example thereof is that a bulk-shaped precursor of an oxide superconductor is formed, and then it is supported by a rod-shaped material, a substrate or a sheet-shaped material which is placed below the precursor and is composed of a heat-resistant material such as $Al_2O_3$, YSZ (yttrium stabilized zirconia) or MgO. Alternatively, a method is employed in which a mixed powder of a superconducting powder having the composition of $YBa_2Cu_3O_{7-x}$ (so-called Y123 powder) and an oxide powder having the composition of $Y_2BaCuO_5$ (so-called Y211 powder), or a mixed powder of a superconducting powder having the composition of $YbBa_2Cu_3O_{7-x}$ (so-called Yb123 powder) and an oxide powder having the composition of $Yb_2BaCuO_5$ (so-called Yb211 powder), which has a peritectic temperature equal to a peritectic temperature of a precursor of a superconductor or lower, is placed on a metal mount or the like.

When a precursor of an oxide superconductor is placed directly on a support member such as a dish or crucible composed of a heat-resistant material such as platinum or $Al_2O_3$ (alumina) and heated to a temperature at which the precursor is partially molten, the precursor in the partially molten state reacts with materials comprised in the heat-resistant material and adheres to the dish or crucible. When the precursor is solidified, the precursor is subjected to large stress due to the difference in thermal expansion coefficient between the precursor and the dish or crucible, resulting in the formation of cracks which are undesirable for an oxide superconductor. The aforementioned general methods are used to avoid these problems.

Namely, in the aforementioned methods, the precursor in partially molten and solidified state is supported with a support member wherein the composition thereof is as close as possible to the composition of the oxide superconductor. As a result, stress loading caused by the difference in thermal expansion coefficient when the precursor is solidified, is reduced, and crack formation is prevented as much as possible in the oxide superconductor obtained with these methods.

In addition, as described in Japanese Unexamined Patent Application, First Publication No. Hei 5-229820, a technology is provided in which a precursor in a partially molten state is supported by floating on molten silver in a metal dish, and then the precursor is solidified from this partially molten state. Here, the silver hardly reacts with an oxide superconductor. It is described in the document that, due to the above characteristic, the resulting oxide superconductor can be easily removed from a solid of the silver after a melting and solidifying the precursor.

However, in the previously described methods using the rod-shaped material, a substrate or a mixed powder which consists of a material having a composition which is similar to the composition of the oxide superconductor, there was still the problem of susceptibility to formation of cracks by reason explained below, although the risk of crack formation is lower than the method using a support member such as a dish or crucible composed of platinum or $Al_2O_3$ (alumina).

Here, when considering the partially molten state of an oxide superconductor, a superconductor powder having the composition of $YBa_2Cu_3O_{7-x}$ decomposes at the peritectic temperature or higher as in the manner of the following formula (I).

$$2YBa_2Cu_3O_{7-x}\ (Y123) = Y_2BaCuO_5\ (Y211) + L\ (3BaCuO_2 + 2CuO) \qquad (I)$$

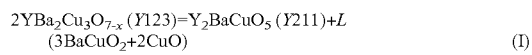

In this formula (I), L represents a liquid phase. X represents the amount of oxygen deficiency in the lattice thereof.

The superconductor in the partially molten state has a liquid phase. Accordingly, when the supporting methods of the prior art are used, problems are thought to occur such that deformation of a lower portion of a precursor in the partially molten state is caused due to its weight when the precursor supported by several rod-like support members is softened, or the bottom of the precursor adheres to the support member as a result of a reaction between the precursor and the support member, or the like. In addition, in the methods in which an oxide superconductor is supported by a support member or mixed powder which has a composition similar to that of the oxide superconductor, a solidified portion (portions in which a reaction has proceeded spontaneously) forms easily that consists of a composite oxide having a composition that contains rare earth elements, and a subtle difference in the coefficients of thermal expansion between the solidified portion and an oxide superconductor which is surrounding the solidified portion is easily formed. In actuality, the inventors of the present invention obtained experimental results demonstrating that cracks form easily in the vicinity of the interface between the aforementioned solidified portion composed from composite oxide (portions in which a reaction has proceeded spontaneously) and the oxide superconductor portion which is surrounding the solidified portion, when this type of oxide superconductor was attempted to be produced by a partial melting and solidification method wherein solidification is conducted from a partially molten state. Here, in the present invention, "partially molten" state means a state in which the 123 phase is melted, while the 211 phase remains in the solid phase and is dispersed in the molten 123 phase.

Among the various types of oxide superconductors, RE-Ba—Cu—O based oxide superconductors (where RE contains a rare earth element) have a high critical temperature and are widely known.

In this type of oxide superconductors, an oxide superconductor wherein Y is used as a rare earth element thereof and the composition thereof is $YBa_2Cu_3O_{7-x}$ is considered that it has a low risk of crack propagation throughout entire bulk of the oxide superconductor, even if fine cracks are partially formed, when the bulk of the oxide superconductor is produced by a partial melting and solidification method. In actuality, a bulk of a Y—Ba—Cu—O based superconductor has been produced having a high critical current density and a diameter of about 100 mm.

However, for example, in the case of an oxide superconductor in which Nd is used as the rare earth element, when fine cracks are formed, the cracks easily propagate throughout the oxide superconductor. Accordingly, if partial cracks form in the oxide superconductor, the cracks propagate throughout the oxide superconductor and break the oxide superconductor, or the oxide superconductor tends to have remarkably low superconductivity characteristics and large cracks penetrating through the entire superconductor. For example, when a Nd based bulk having superior superconductivity characteristics is produced using the partial melting and solidification method, a current production limit is a production of a bulk having a diameter of about 30 mm. However, such a bulk having the diameter is unable to be produced at satisfactory yield due to the presence of cracks.

It is understood from documents describe below regarding the difficulty in obtaining large, bulk-shaped oxide superconductors that are free of cracks and other defects, that "As the size of bulk materials made to undergo crystal growth becomes larger, the length of time required for crystal growth increases. As a result, prolonged heat treatment is conducted in the partial molten state, and compositional variations and the like are caused due to a loss in liquid phase components, or contamination caused from materials contained in the substrate or the like, thereby making it difficult to obtain high-quality crystals." Examples of these documents include a document published by D. A. Cardwell entitled "Processing, microstructure and characterization of artificial joint in top seeded melt grown Y—Ba—Cu—O" in "Institute of Physics Publishing Superconductor Science and Technology, 15 (2002) 639-647", a document published by Lihua Chen entitled "Joining of melt-textured YBCO: A direct contact method" in "Institute of Physics Publishing Superconductor Science and Technology, 15 (2002) 672-674", and a document described by Naomichi Sakai, et al. entitled "Microgravity Superconductor Production Project" in "Cryogenics, 34, 11 (1999) p. 563".

In consideration of the aforementioned problems, an object of the present invention is to provide a technology which enables a production of a large, bulk-shaped oxide superconductor that is free of defects, wherein cracks which are caused by a difference in the coefficients of thermal expansion between an oxide superconductor and a support member are not formed when a production of an oxide superconductor is carried out using a partial melting and solidification methods.

Another object of the present invention is to provide a preferable substrate material for supporting a precursor of an oxide superconductor, which is usable for producing a large, bulk-shaped oxide superconductor free from cracks by using a partial melting and solidification method.

In addition, another object of the present invention is to provide a large, bulk-shaped oxide superconductor free from cracks by using a partial melting and solidification method.

Moreover, another object of the present invention is to provide a technology that enables a production of a bulk-shaped Nd based oxide superconductor having a diameter of about 30 mm or more, which is currently the largest size in the world.

DISCLOSURE OF THE INVENTION

A first aspect of the present invention is a method for producing an oxide superconductor comprising: placing a precursor of an oxide superconductor on a substrate material containing pure metal or a compound which is meltable in the precursor when the precursor is in a partially molten state, and producing the oxide superconductor by partial melting and solidifying the precursor in said state.

A second aspect of the present invention is a substrate material for supporting a precursor of an oxide superconductor, wherein the substrate material is used in a method for producing an oxide superconductor by solidification from a partially molten state of a precursor of an RE-Ba—Cu—O based oxide superconductor wherein RE represents a rare earth element, and the substrate material consists of a material which contains Ba or Cu but does not contain a rare earth element in the partially molten state.

A third aspect of the present invention is an RE-Ba—Cu—O based oxide superconductor, wherein RE represents a rare earth element, and the oxide superconductor includes a portion which is solidified after melting and contains one of or both of Ba and Cu but does not contain a rare earth element on an outside face of the oxide superconductor, and the solidified portion corresponds to a substrate material which is used for supporting a precursor of the RE-Ba—Cu—O based oxide superconductor when the precursor was partially melted and solidified.

BEST MODE FOR CARRYING OUT THE INVENTION

Figure 1:
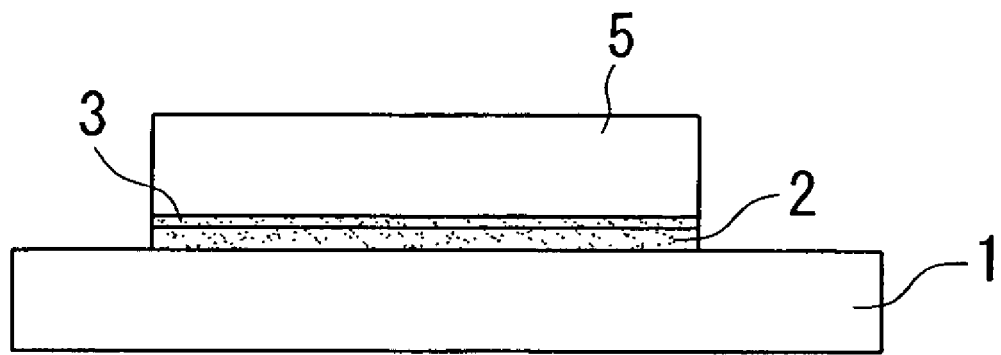
FIG. 1 is a schematic illustration which explains a state in which the method of the present invention is carried out using a precursor of an oxide superconductor.

The present invention relates to a method for producing an oxide superconductor having a high critical current density by using a partial melting and solidification method, and an oxide superconductor which is produced according to that method. More particularly, the present invention relates to a technology wherein a large oxide superconductor in which cracks and other defects do not form in the resulting oxide superconductor can be produced.

In order to achieve the aforementioned objects, the present invention provides a method for producing an oxide superconductor wherein a precursor of an oxide superconductor is solidified after partial melting. In the method, the precursor is placed on a substrate material containing a compound or pure metal which is able to melt in the precursor in a partially molten state, and then an oxide superconductor is produced by partial melting and solidifying the precursor from this state.

The partial melting and solidification is carried out while a precursor which is partially melted is supported with a substrate material comprising a compound or pure metal that can be melted in the partially melted precursor. Consequently, even if a portion of materials comprised in the substrate material melts in the precursor which is heated to a high temperature and is in the partially molten state, a portion at which a reaction proceeds preferentially does not occur in the precursor. Accordingly, an oxide superconductor which is obtained after partially melting and solidification hardly has cracks which are formed due to a difference in coefficients of thermal expansion.

Here, a partial melting and solidification method is known as a production method described below. After obtaining a raw material mixed molding (precursor) which is molded after mixing a plurality of compounds of elements which form an oxide superconductor, this precursor is melted by heating at a temperature equal to or higher than the melting point thereof. Subsequently, the precursor is cooled gradually while applying a temperature gradient, and a seed crystal is placed in a portion of the precursor at a temperature immediately before a temperature at which crystallization of the precursor is caused, and crystal is grown inside the precursor using the seed crystal as starting point. In this manner, an oxide superconductor is obtained having a well aligned crystal structure and superior superconductivity characteristics.

In order to achieve the aforementioned objects, the present invention has a characteristic in which a substrate material is used and the substrate material consists of a pure metal or compound which is meltable in a partially molten precursor uniformly. The pure metal and compound does not allow the formation of a region, in which reaction proceeds spontaneously to form stress concentration cracks in the oxide superconductor. The cracks are resulting from a difference in the coefficients of thermal expansion between the substrate material and the oxide superconductor.

The precursor in a partially molten state is supported with the substrate material which can be uniformly melted in a partially molten precursor and does not cause the formation of a region in which a reaction proceeds spontaneously. Accordingly, even if a region of composite materials included in the substrate material melts in the precursor in a partially molten state which is heated to a high temperature, a uniform molten state can be achieved, and a region at which a reaction proceeds spontaneously is not formed in the precursor. Therefore, it is difficult for cracks to form and exist in the precursor due to a difference in the coefficients of thermal expansion, after conducting partial melting and solidification process of the precursor.

In order to achieve the aforementioned objects, the present invention has a characteristic in which the oxide superconductor is a RE-Ba—Cu—O based oxide superconductor, wherein the RE represents a rare earth element, and the substrate material contains Ba or Cu but does not contain a rare earth element in a molten state.

Specific examples of the oxide superconductor can be selected from RE-Ba—Cu—O based oxide superconductors, and materials which form the substrate material can be selected from materials that contain Ba or Cu, but does not contain a rare earth element.

A region at which a reaction proceeds preferentially comprises a composite oxide which has the different composite ratio than the target oxide superconductor and comprises a rare earth element, Ba, Cu and O which form an oxide superconductor. The region has a different coefficient of thermal expansion than the body of an oxide superconductor obtained by a partially melting and solidification method. Accordingly, the difference of the coefficients of thermal expansion causes the formation of cracks during solidification following partially melting. Hence, an oxide superconductor in which cracks do not form can be provided by combining a precursor and a substrate material so that a region at which a reaction proceeds preferentially does not generate therein even after partial melting and solidification.

In order to achieve the aforementioned objects, the present invention has a characteristic in which, after placing an intermediate layer containing at least one selected from the group consisting of $Y_2O_3$, $Yb_2O_3$, $Er_2O_3$, $Ho_2O_3$, $Dy_2O_3$, $Eu_2O_3$, $Sm_2O_3$, $Gd_2O_3$, $ZrO_2$, $Al_2O_3$, $BaZrO_3$, MgO and yttrium stabilized zirconia (YSZ) on a mount made of a heat-resistant material, a substrate material is placed on the mount, and a precursor of the oxide superconductor is placed on the substrate material when partial melting and solidification of the precursor is conducted.

The intermediate layer hardly reacts at all with the mount during partial melting and solidification, or a reaction between the intermediate layer and the mount can be suppressed. Furthermore, the substrate material provided on the intermediate layer does not react with the precursor. Accordingly, the precursor does not react with the mount during partial melting and solidification process, and unnecessary portions at which a reaction proceeds spontaneously are not formed in the precursor. As a result, cracks do not form in the resulting oxide superconductor which is obtained after partial melting and solidification process of the precursor.

In order to achieve the aforementioned objects, the present invention is to use a substrate material, and specific examples of the substrate material include the substrate materials comprising one of or two or more kinds of a pure metal of Ba (melting point: 725° C.) or Cu (melting point: 1083° C.), alloys, or oxides, composite oxides, carbonates, sulfides, sulfates, chlorides, hydroxides and nitrates of Ba or Cu.

In order to achieve the aforementioned objects of the present invention, one of or two or more kinds of BaO (melting point: 1920° C.), CuO (melting point: 1026° C.), $Cu_2O$ (melting point: 1232° C.), $BaCuO_2$ (melting point: 980° C.), $BaCO_3$ (melting point: 811° C.), $CUCO_3$ (melting point: 220° C.), BaS (melting point: 1200° C.), CuS (melting point: 220° C.), $BaSO_4$ (melting point: 1580° C.), $CuSO_4$ (melting point: 200° C.), $BaCl_2$ (melting point: 963° C.), CuCl (meltingpoint: 430° C.), $CuCl_2$ (meltingpoint: 620° C.) $Ba(OH)_2$ (melting point: 78° C.), $Cu(OH)_2$ (melting point: 220° C.), $Ba(NO_3)_2$ (melting point: 592° C.) and $Cu(NO_3)_2$ (melting point: 114.5° C.) can be selected and used in the present invention, as the aforementioned oxides, composite oxides, carbonates, sulfides, sulfates, chlorides, hydroxides or nitrates of Ba or Cu.

In order to achieve the aforementioned objects, specific examples of a substrate material used in the present invention include substrate materials comprising one of or two or more kinds of noble metals such as Ag (melting point: 962° C.), Au (melting point: 1065° C.), Pt (melting point: 1772° C.) and Pd (melting point: 1554° C.), or an oxide of the noble metals such as $Ag_2O$ (melting point: 300° C.) and $PtO_2$ (melting point: 450° C.) These pure metals or compounds either certainly melt in a precursor which is in the partially molten state or remain in their original form without melting, when a partially melting and solidification process is conducted in a heat treatment in the range of 1000 to 1200° C.

A substrate material for supporting a precursor of an oxide superconductor of the present invention is the material which can be melted in a partially molten state. The substrate material can be used in a process for producing an oxide superconductor wherein the process is conducted by solidification of a precursor of an RE-Ba—Cu—O based oxide superconductor from a partially molten state (RE represents a rare earth element). The substrate material consists of a material which contains Ba or Cu but does not contain a rare earth element in the molten state.

One of or two or more kinds of a pure metal of Ba or Cu, oxides, composite oxides, carbonates, sulfides, sulfates, chlorides, hydroxides or nitrates of Ba or Cu, can be used as constitutive materials included in the aforementioned substrate material.

Examples of these compounds which can be contained in the substrate material comprise the aforementioned various compounds listed above.

In order to achieve the aforementioned objects, the present invention has a characteristic in which an RE-Ba—Cu—O based oxide superconductor (RE represents a rare earth element) which is produced by partial melting and solidifying a precursor of the oxide superconductor is provided. A molten and solidified region, which contains one of or both of Ba and Cu but does not contain a rare earth element, is formed and contained as a portion of the oxide superconductor. The precursor was supported by the portion, when the precursor was partially melted and solidified.

When an oxide superconductor is produced by melting and solidifying a precursor which is supported with a substrate material that can melt in the precursor but does not contain a rare earth element, a molten and solidified region which does not contain a rare earth element but contains either or both of Ba and Cu is formed in a region at which the precursor was supported. A region in which a reaction has proceeded spontaneously is not formed in the molten and solidified portion of the oxide superconductor, which is produced by partial melting and solidification. Therefore, there are few places having different coefficients of thermal expansion in the resulting oxide superconductor, and an oxide superconductor having superior superconductivity characteristics is obtained in which the cracks caused by the differences in coefficient of thermal expansion during solidification do not form.

In order to achieve the aforementioned objects of the present invention, one of or two or more kinds of a noble metal such as Ag, Au, Pt or Pd may be additionally contained in the aforementioned molten and solidified portion. In order to achieve the aforementioned objects, the present invention has a characteristic in which the aforementioned molten and solidified portion is formed in the bottom of the precursor of the aforementioned oxide superconductor.

FIG. 1 is a schematic illustration for explaining a state in which the production method of the present invention is carried out, and it shows a state in which a precursor 5 of an oxide superconductor is placed on a plate-shaped mount 1 made of a heat-resistant material via an intermediate layer 2 and a substrate material 3 which are interposed between the mount and the precursor.

Although the outer shape of the aforementioned mount 1 is a plate as shown in FIG. 1, the mount 1 may have any arbitrary shape insofar as it has a shape that allows placement of precursor 5, and it may have the shape of a board, crucible or the like. Since this mount 1 should be able to withstand the temperature at which a melting and solidification method as described later is carried out on precursor 5 (for example, 950 to 1200° C.), the mount is composed of heat-resistant material such as $Al_2O_3$ (alumina), MgO or YSZ (yttrium-stabilized zirconia), and an example of which is heat-resistant ceramics.

In this example, the aforementioned intermediate layer 2 and substrate material 3 are formed into a layered form using an aggregate of powder thereof, thereafter, the intermediate layer 2 is placed on the mount 1, and the substrate material 3 is placed on the intermediate layer 2, and the precursor 5 is placed on the substrate material 3. The intermediate layer 2 and substrate material 3 are placed on the mount 1 by spreading out each powder thereof, which is described later, on the mount in that order using a providing tool such as a square form.

The aforementioned intermediate layer 2 consists of $Y_2O_3$, $Yb_2O_3$, $Er_2O_3$, $Ho_2O_3$, $Dy_{2O3}$, $EU_2O_3$, $Sm_2O_3$, $Gd_2O_3$, $ZrO_2$, $Al_2O_3$, $BaZrO_3$, MgO or yttrium-stabilized zirconium (YSZ). More specifically, it is formed into a layer with a powder selected from these materials. The intermediate layer 2 is provided as a reaction inhibiting layer to prevent a reaction between a mount 1 composed of a heat-resistant material such as alumina and a substrate material 3 made of a material to be described later. Furthermore, although the intermediate layer 2 has a layered structure in which a powder is spread out, another intermediate layers such as those in which the aforementioned material has been processed into the form of a sheet or plate in advance can also be used.

It is preferable that a material included in the aforementioned intermediate layer 2 is a material which has low reactivity with a mount 1 as those listed above, and simultaneously has low reactivity with a substrate material 3 as well.

A material which does not react with precursor 5 but melts when the precursor 5 is in the partially molten state can be used for the aforementioned substrate material 3. Examples of the material include a pure metal powder of Ba or Cu, and a powder of a compound containing Ba and Cu.

More specifically, a material which consists of one of or two or more kinds of an oxide powder, composite oxide powder, carbonate powder, sulfide powder, sulfate powder, chloride powder, hydroxide powder or nitrate powder of Ba or Cu can be used as the substrate material.

Moreover, one of or two or more kinds of powder of BaO (melting point: 1920° C.), CuO (melting point: 1026° C.), $Cu_2O$ (melting point: 1232° C.), $BaCuO_2$ (melting point: 980° C.), $BaCO_3$ (melting point: 811° C.), $CuCO_3$ (melting point: 220° C.), BaS (melting point: 1200° C.), CuS (melting point: 220° C.), $BaSO_4$ (melting point: 1580° C.), $CuSO_4$ (melting point: 200° C.), $BaCl_2$ (melting point: 963° C.), CuCl (melting point: 430° C.), $CuCl_2$ (melting point: 620° C.), $Ba(OH)_2$ (melting point: 78° C.), $Cu(OH)_2$ (melting point: 220° C.), $Ba(NO_3)_2$ (melting point: 592° C.) or $Cu(NO_3)_2$ (melting point: 114.5° C.) can be selected and used as specific examples of the aforementioned oxide powder, composite oxide powder, carbonate powder, sulfide powder, sulfate powder, chloride powder, hydroxide powder or nitrate powder of Ba or Cu.

When a compound having a low melting point is selected from them and used for the substrate material, the objects of the present invention can be achieved such that the compound is certainly decomposed at the heating temperature during a partial melting and solidification process, components such as C, S, Cl, OH and $NH_3$ are removed by decomposition, Ba or Cu are uniformly melted in the precursor 5 which is in the partially molten state, and a molten region, in which there is no formation of a portion at which a reaction proceeds spontaneously, is formed. In addition, even in the case of a material having a high melting point that does not undergo complete thermal decomposition at a heating temperature in melting and solidification process, when it is an oxide based powder, a compound can be formed due to a mutual reaction by simultaneously using the oxide based powder and another powder since oxygen is contained in the oxide superconductor, and uniform melting is achieved at the heating temperature of melting and solidification process, and thus problems are not caused.

In addition to the aforementioned pure metals and compounds, specific examples of metals and compounds which are usable for the aforementioned substrate material 3 include one of or two or more kinds of noble metals such as Ag (melting point: 962° C.), Au (melting point: 1065° C.), Pt (melting point: 1772° C.) and Pd (melting point: 1554° C.), alloys of these noble metals, and oxides of the aforementioned noble metals, such as $Ag_2O$ (melting point: 300° C.) and $PtO_2$ (melting point: 450° C.). These pure metals or compounds either certainly melt in the partial molten state of the precursor 5, or remain in their original form without melting at all, when a partial melting and solidification process is carried out by heat treating within the range of 1000 to 1200° C. In the case of the metals or compounds that remain in their original form, some elements thereof may have the possibility of dispersing in the precursor 5 which is in the partially molten state. However, even if the elements are dispersed, they can melt in precursor 5, and therefore, a portion described later in which a reaction has proceeded spontaneously can be made not to occur in the final form of the oxide superconductor.

The precursor 5 of the aforementioned oxide superconductor is a compact of a mixture of raw materials wherein the mixture has the same or a similar composition as the composition of the target oxide superconductor. An example thereof is a RE-Ba—Cu—O type composition (wherein RE represents a rare earth element including Y (one of or two or more kinds of La, Nd, Sm, Eu, Gd, Dy, Ho, Er, Tm, Yb or Lu)). Here, in the case the composition of the target oxide superconductor is $NdBa_2Cu_3O_7$-x, for example, the precursor 5 is obtained such that a powder having a composition of $NdBa_2Cu_3O_{7-x}$ and a powder having a composition of $Nd_4Ba_2Cu_2O_{10}$ are mixed and compressed followed by sintering in pure oxygen. In the case the target oxide superconductor has a composition of $SmBa_2Cu_3O_{7-x}$, an example of the precursor 5 is obtained such that a powder having a composition of $SmBa_2Cu_3O_{7-x}$ and a powder having a composition of $Sm_2BaCuO_5$ are mixed and compressed. In the case the composition of the target oxide superconductor is $GdBa_2Cu_3O_{7-x}$, an example of precursor 5 is obtained such that a powder having a composition of $GdBa_2Cu_3O_{7-x}$ and a powder having a composition $Gd_2BaCuO_5$ are mixed and compressed.

In the case of the state shown in FIG. 1, the precursor 5 is heat-treated according to a partial melting and solidification method.

Here, a partial melting and solidification method comprises, mixing a plurality of compounds having each element that is included in an RE-Ba—Cu—O based oxide superconductor, compacting the mixture to obtain a molding of the mixture of raw materials, and then heating and melting this molding at a temperature equal to or higher than its melting point to drive the molding into a partially molten state while retaining the form of the molding. Next, the molding is cooled slowly while applying a temperature gradient, a seed crystal is placed on top of the precursor at the temperature which is slightly higher than the crystallization temperature, and crystal is grown inside the precursor using the seed crystal as a stating point. These steps constitute a method which is known as a production method for obtaining an oxide superconductor.

Namely, the precursor 5 is put into a partially molten state by heating to a temperature slightly higher than the melting point of the precursor 5 so that the form of precursor 5 itself is not disturbed. In addition, an oxygen atmosphere in which a minute amount of oxygen is supplied in an inert gas is used for the heating atmosphere. For example, an argon gas atmosphere having an oxygen concentration of 1% can be used for a heating atmosphere of the present invention.

The heating temperature at this time can vary slightly depending on the composition of the target oxide superconductor, or the components of the atmospheric gas used in the heat treatment. In an inert gas atmosphere containing 1% oxygen, the range of the heating temperature is generally 1000 to 1200° C. when an Nd based oxide superconductor is formed, or generally 970 to 1200° C. when other types of oxide superconductors are formed.

Figure 2:
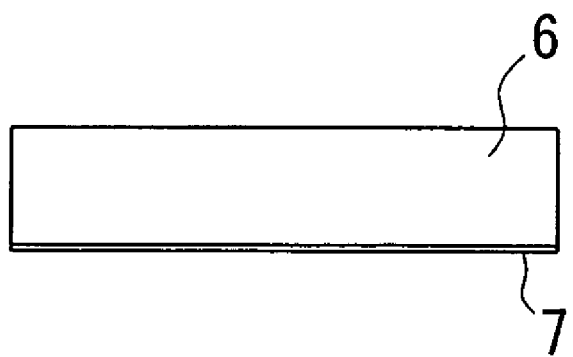
FIG. 2 is a schematic illustration which shows a bulk-shaped oxide superconductor obtained according to the method of the present invention.

Once the precursor 5 has been put into a partially molten state, a seed crystal is placed on the top of the precursor 5 at the temperature, which is slightly higher than the crystallization temperature. Then, the temperature is further slowly lowered in a stepwise manner, and the precursor 5 is held at a predetermined temperature for several tens of hours and then it is furnace-cooled. For example, a seed crystal is placed on the top of a precursor 5 after the precursor is gradually cooled to a temperature several tens of degrees lower than the temperature at which the precursor is in the partially molten state. Subsequently, by slowly cooling the aforementioned precursor to a temperature an additional several tens of degrees lower, and holding the precursor at that temperature for several tens of hours and then furnace-cooled, an oxide superconductor 6 like that shown in FIG. 2 is obtained. For example, if a temperature at which a precursor is partially molten is 1100° C., precursor 5 is cooled to 1010° C., and then a seed crystal is placed on the surface of the precursor 5. Further, it is slowly cooled to 1000° C. Then, after slowly cooling to 989° C., it is held at that temperature for 60 hours, and then furnace cooled.

In the partial molten state, based on the previously described formula (I), a decomposition into $Y_2BaCuO_5$ (Y211 phase) and L (liquid phase) ($3BaCuO_2+2CuO$) is taking place inside the precursor 5. The liquid phase tends to push out the Y211 phase towards the bottom (toward a side which is away from the seed crystals), when a crystal of the oxide superconductor having the composition ratio of $YBa_2Cu_3O_{7-x}$ (Y123 phase) grows by using the seed crystal as a starting point. As a result, the whole body of the precursor 5 is crystallized, and a bulk of an oxide superconductor having the composition $YBa_2Cu_3O_{7-x}$ (Y123 phase) is obtained.

In the case of carrying out the partial melting and solidification method in this manner, a portion of the substrate material 3 also melts at the bottom side of the precursor 5 if the precursor 5 is allowed to remain in the partially molten state for a long period of time. Materials comprised in the substrate material 3 are mainly Ba or Cu and able to melt into precursor 5 in the partially molten state. Therefore, even if the substrate material melts, the substrate material has the same component as the liquid phase ($3BaCuO_2+2CuO$) which is formed within the precursor 5 when the precursor is in the partially molten state. Accordingly, it does not contaminate the precursor 5 in the partially molten state. Namely, there is no formation of a spontaneously nucleated region (composite oxide portion) that has the composition ratio different from the target ratio of the target oxide superconductor wherein the difference is caused by a reaction which proceeds separately from a reaction which forms the oxide superconductor. In addition, a molten and solidified portion 7 that is produced due to a molten reaction between a substrate material 3 and an oxide superconductor is formed as shown in FIG. 2 on the bottom side of an oxide superconductor 6.

When slowly cooling a precursor 5 in the partially molten state and solidifying it followed by crystal growth, since a spontaneously nucleated region, which has a coefficient of thermal expansion different from that of the oxide superconductor having the target composite ratio, is not formed in precursor 5, the oxide superconductor is not subjected to thermal stress caused by the difference in the coefficients of thermal expansion between a spontaneously nucleated region and the oxide superconductor portion. Consequently, an oxide superconductor 6 in which cracks are not formed in the cooling stage is obtained without defects.

Since the oxide superconductor 6 that is free of cracks can be produced, according to the present invention, an oxide superconductor having superior superconductivity characteristics and free of cracks and other defects can be produced. Furthermore, since the resulting oxide superconductor is free of cracks, in the case of, for example, cooling an oxide superconductor to the temperature of liquid nitrogen and applying an external magnetic field followed by removing the external magnetic field to trap the magnetic field in the oxide superconductor, the oxide superconductor is able to demonstrate performance of showing a high peak of the trapped magnetic field. In addition, since the resulting oxide superconductor does not contain cracks, the trapped magnetic field has a single peak. However, in the case of an oxide superconductor containing multiple cracks, the measurement of the distribution of the trapped magnetic field thereof reveals that the trapped magnetic field has divided into multiple peaks, and at the same time, the trapped magnetic peaks are extremely low. Naturally, a crack-free oxide superconductor is superior to an oxide superconductor that contains cracks in terms of critical current density as well.

A molten and solidified portion 7 formed in oxide superconductor 6 is shown in FIG. 2 wherein it has been formed over the entire bottom surface. However, molten and solidified portion 7 is not always formed over the entire bottom surface. The portion may only be formed at a portion of the bottom surface depending on the supported state of precursor 5, the temperature, the production conditions and so forth. For example, in the embodiment of FIG. 1, precursor 5 is supported with a layer in which a powder is provided. However, if a rod-shaped substrate material, frame-shaped substrate material, or pedestal-shaped substrate material or the like is used to support precursor 5 instead of the powder layer, a molten and solidified portion partially forms on the bottom side of the oxide superconductor, mainly at the portion where there is contact between the substrate material and precursor 5. In addition, in the previously described ideal reaction state, a rare earth element, which is one of the chemical elements of the target oxide superconductor, is not contained in the molten and solidified portion 7 which is formed at a portion of the interface between precursor 5 and substrate material 3. However, a certain amount of rare earth elements may be partially contained depending on the reaction conditions.

Next, in the present embodiment, an intermediate layer 2 is interposed between a mount 1 made of a heat-resistant material and a substrate material 3 in order to eliminate or inhibit the reaction between them. Accordingly, since the substrate material 3 does not react with the intermediate layer 2, and the substrate material 3 is composed of a material that does not form a spontaneously nucleated region by melting with the precursor 5 formed on the substrate material 3, a portion in which a reaction proceeds spontaneously can be reliably prevented from occurring in the precursor 5. Furthermore, the material used for intermediate layer 2 is required to withstand heat and not to melt when a melting and solidification method is carried out. Even if a portion of an intermediate layer 2 melts, it is preferable that the intermediate layer 2 hardly reacts or a reaction with mount 1 can be inhibited, and the intermediate layer hardly reacts or the reaction of the intermediate layer with substrate material 3 can be inhibited.

In the case of forming the aforementioned substrate material 3 into the shape of a rod or frame, a plurality of rod-shaped substrate materials 3 may be placed directly on a mount 1, and a precursor 5 may be placed thereon followed by carrying out a melting and solidification method. In that case, the reaction with the mount 1 can be inhibited by heating the rod-shaped substrate material so as not to melt. In addition, if the substrate material has an adequately large size, even if a reaction occurs at a region in contact with the mount, an intermediate layer 2 is not necessary to be used since the reaction of the mount 1 no longer has an effect on the portion at which the precursor 5 is supported with the substrate material.

Naturally, an intermediate layer 2 may be affixed to the mount 1 side of the substrate material formed into the shape of a rod, frame or the like, or may be arranged at the portion that makes contact with mount 1, in order to inhibit the reaction between the substrate material formed into the shape of a rod or frame and mount 1.

EXAMPLES

Example 1

A pulverized sintered material having the compositional ratio of $NdBa_2Cu_3O_{7-x}$ (Nd123) and a pulverized oxide having a composition of $Nd_4Ba_2Cu_2O_{10}$ were weighed and mixed so that their blending ratio was 5:1. Moreover, 10% by weight of silver oxide ($Ag_2O$) powder was added for the purpose of inhibiting the variation in mechanical strengths of a bulk-shaped oxide superconductor to be produced, and a mixture thereof was obtained. This mixture was mixed and pulverized for 3 hours with a powder mixing device to obtain a mixed powder of raw materials. The silver oxide added has the effect of lowering the peritectic temperature of the aforementioned Nd123. In addition, since the peritectic temperature of a bulk having a composition of $NdBa_2Cu_3O_{7-x}$ is the highest among RE-Ba—Cu—O based rare earth oxide superconductors, and since suitable seed crystals are not known in the state of not adding silver, 10% silver oxide was added by weight in this example.

Uni-axial pressing was carried out on the aforementioned mixed powder of raw materials at a pressure of 1.5 tons to mold into a pellet (diameter: 40 mm, thickness: 13 mm) Subsequently, this pellet was subjected to cold isostatic pressing treatment at a pressure of 2 tons/cm² to produce two bulks. These bulks were then sintered at 1040° C. in pure oxygen to obtain two precursors.

Next, a $Y_2O_3$ powder layer (intermediate layer) was formed on an alumina ($Al_2O_3$) boat (mount). This $Y_2O_3$ powder layer was formed by spreading $Y_2O_3$ powder to a thickness of about 2 mm on the aforementioned boat using a square form. Next, $BaCuO_2$ powder was spread to a thickness of about 2 mm on the $Y_2O_3$ powder layer using a square form to form a $BaCuO_2$ powder layer (substrate material), and the aforementioned precursor was placed thereon to obtain a sample of the present invention.

In addition, the same $Y_2O_3$ powder layer as that described above was formed on an alumina ($Al_2O_3$) boat, and a mixed powder, consisting of a powder having the composition of $YbBa_2Cu_3O_{7-x}$ (Yb123) and a powder having a composition of $Yb_2BaCuO_5$ was spread to a thickness of about 2 mm using a square form thereon followed by placing the aforementioned precursor thereon to prepare a comparative material.

The sample of the present invention and comparative material were placed in an argon gas atmosphere containing 1% oxygen, heated to 1100° C. to let the precursors into a partially molten state, and then held at 1100° C. for 1 hour. Subsequently, the sample and comparative material were cooled to 1010° C. over 2 hours, and Nd based seed crystals to which silver oxide had not been added were placed on the top surface of the precursors in the partially molten state followed by cooling to 1000° C. over 5 minutes. Next, the sample and comparative material were slowly cooled to 989° C. at the rate of 1° C./hour, and held for 60 hours at this temperature (989° C.), and then furnace-cooled to obtain disk-shaped oxide superconductors having a diameter of 30 mm and a thickness of 10 mm.

The resulting oxide superconductors were taken out of the furnace and observed. A spontaneously nucleated region (composite oxide portion) at which Yb was preferentially reacting with the precursor in partially molten state was confirmed at multiple locations on the bottom of the oxide superconductors of the comparative materials. A plurality of cracks had formed with these spontaneously nucleated regions being starting points, and some of the cracks were able to be confirmed to be penetrating from the bottom to the top surface of the oxide superconductors.

Figure 3:
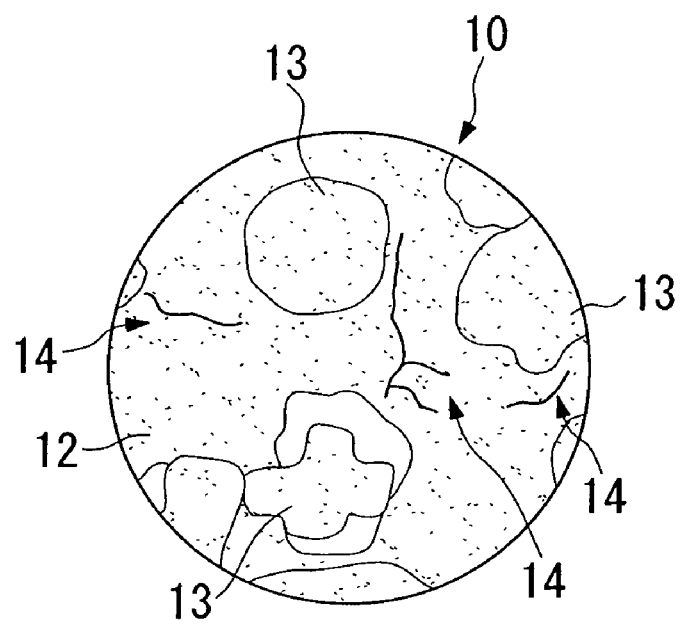
FIG. 3 is a schematic illustration of a bottom of an oxide superconductor which has a composition of $NdBa_2Cu_3O_{7-x}$ and is obtained in Examples as a comparative material.

FIG. 3 is a schematic view of a structural photograph of the bottom of an oxide superconductor of the comparative material. A plurality of dark-colored, spontaneously nucleated region 13 with no crystal orientation are randomly formed in the body portion 12 of the oxide superconductor which has a general and homogeneous sandy pattern, and a plurality of cracks 14 are formed with the spontaneously reacting portions 13 being starting points.

Figure 4:
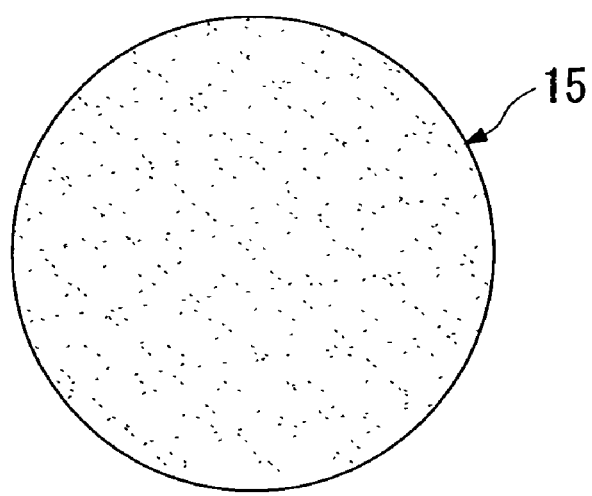
FIG. 4 is a schematic illustration of a bottom of an oxide superconductor, which has a composition of $NdBa_2Cu_3O_{7-x}$ and is obtained in Examples according to the present invention.

In contrast, a spontaneously nucleated region was unable to be seen in the bottom of the sample, and cracks did not form in the oxide superconductor sample of the present invention. FIG. 4 is a schematic view of a photograph of the bottom of the sample of the oxide superconductor of this example, and it was observed that the oxide superconductor 15 has a structure having a homogeneous and fine sandy pattern.

Furthermore, a portion was confirmed in the bottom of the sample of the oxide superconductor of the present invention, at which a portion of the $BaCuO_2$ powder layer had melted and solidified after the layer melted with the partially molten precursor. It is presumed that cracks did not form since this melted and solidified portion had a surface structure having minute and fine pattern and demonstrated dense structural continuity with the other portions.

In the next step, the aforementioned oxide superconductor of the present invention was cooled using liquid nitrogen in a 7 T (tesla) external magnetic field. After the magnetic field was removed, the trapped magnetic field distribution of the surface was observed. The trapped magnetic field distribution was confirmed to have a single peak free of the effects of cracks and so forth. In addition, the maximum value of the single peak of the trapped magnetic field was 1.1 T, thereby clearly demonstrating that an extremely high magnetic field could be trapped. Next, when the trapped magnetic field on the bottom surface of the same oxide superconductor was observed, the maximum value of the trapped magnetic field was 1.25 T, thereby confirming that an oxide superconductor could be produced having a high trapped magnetic field on both the top and bottom sides.

On the other hand, the trapped magnetic field distribution of the oxide superconductor of the comparative material decreased due to the presence of cracking. This magnetic field distribution had multiple peaks, and the maximum values of the peaks were low such that a maximum value on the top surface of the oxide superconductor was 0.65 T and a maximum value on the bottom surface thereof was 0.2 T. This indicates that a plurality of cracks had formed in the bottom surface of the oxide superconductor of this comparative material, some of which had penetrated the oxide superconductor and reached the upper portion thereof.

Example 2

A pulverized sintered material having the compositional ratio of $SmBa_2Cu_3O_{7-x}$ (Sm123) and a pulverized oxide having a composition of $Sm_2BaCuO_5$ (Sm211) were weighed so that their blending ratio was 3:1. Moreover, 0.5% by weight of Pt and 10% by weight of silver oxide ($Ag_2O$) powder used for the purpose of inhibiting variations in mechanical strength of a bulk oxide superconductor to be produced were added, and a mixture is obtained. This mixture was mixed and pulverized for 3 hours in a powder mixing device to obtain a mixed powder of raw materials.

Uni-axial pressing was carried out on the aforementioned mixed powder of raw materials at a pressure of 1.5 tons to mold into a pellet (diameter: 40 mm, thickness: 13 mm). Subsequently, this pellet was subjected to cold isostatic pressing treatment at a pressure of 2 tons/cm² to obtain two precursors.

Next, a $Y_2O_3$ powder layer (intermediate layer) was formed on an alumina ($Al_2O_3$) boat (mount) in the same manner as Example 1, a $BaCuO_2$ powder layer (substrate material) was formed thereon, and furthermore, the aforementioned precursor was placed thereon to obtain a sample of the present invention.

In addition, the same $Y_2O_3$ powder layer as that described above was formed on an alumina ($Al_2O_3$) boat, and a mixed powder consisting of a powder having the compositional ratio of $YbBa_2Cu_3O_{7-x}$ (Yb123) and a powder having a compositional ratio of $Yb_2BaCuO_5$ was spread thereon followed by placing the aforementioned precursor thereon to prepare a comparative material.

The sample and comparative material were placed in an argon gas atmosphere containing 1% oxygen, heated to 1090° C. to put the precursors into a partially molten state, and then held at 1090° C. for 1 hour. Subsequently, the sample and comparative material were cooled to 1000° C. over 2 hours, and a Nd based seed crystal to which silver oxide had not been added was placed on the top surface of the precursors in the partially molten state followed by cooling to 990° C. over 5 minutes. Next, the sample and comparative material were slowly cooled to 975° C. at the rate of 1° C./hour, held for 70 hours at this temperature (975° C.), and then furnace-cooled to obtain disk-shaped oxide superconductors having a diameter of 30 mm and a thickness of 10 mm.

The resulting oxide superconductors were observed. A spontaneously nucleated region (composite oxide portion) in which Yb preferentially reacted with the precursor in partially molten state was confirmed at multiple locations on the bottom of the oxide superconductor of the comparative material. A plurality of cracks had formed with these spontaneously nucleated region being starting points.

In contrast, a spontaneously nucleated region was unable to be seen in the bottom of the oxide superconductor sample of the present invention, and cracks did not form in the sample.

Figure 5A:
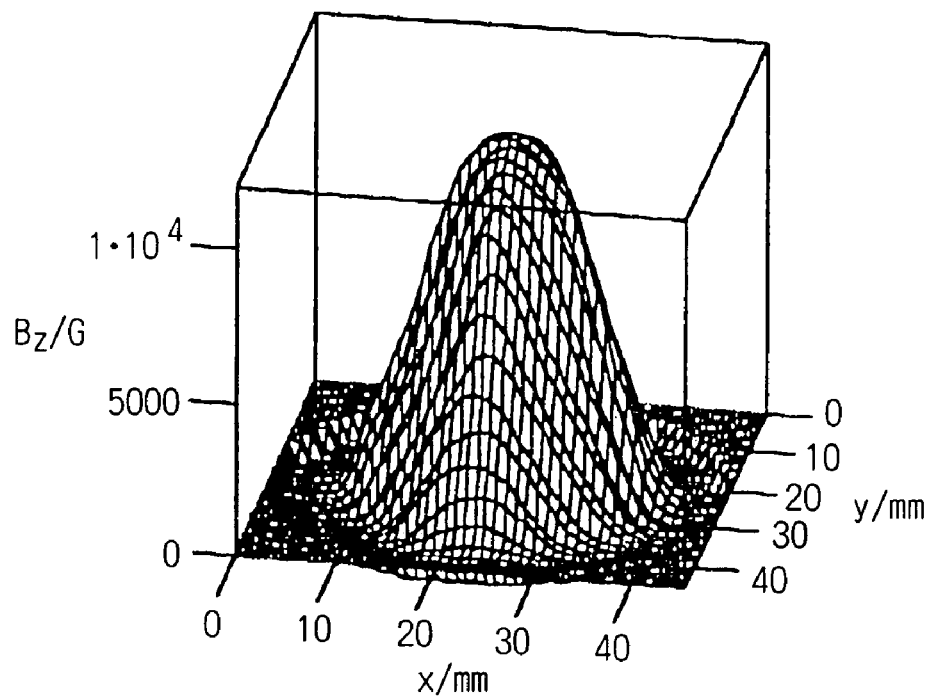
FIG. 5A is a graph showing a trapped magnetic field distribution of a top surface of an oxide superconductor obtained in Examples according to the present invention.
Figure 5B:
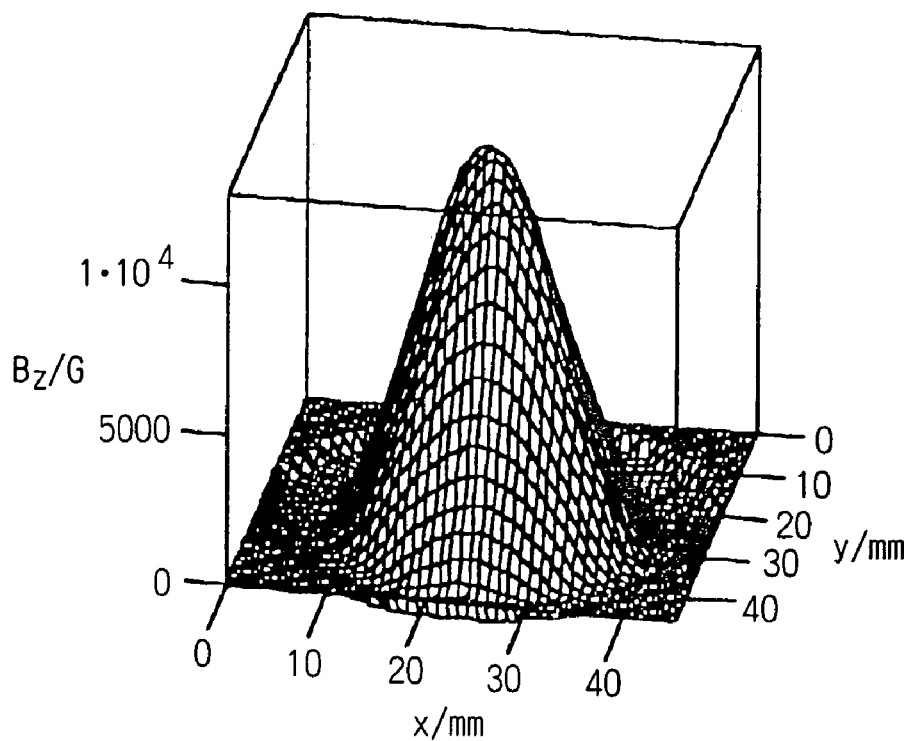
FIG. 5B is a graph showing the trapped magnetic field distribution of a bottom surface of the oxide superconductor obtained in Examples according to the present invention.

In the next step, the aforementioned oxide superconductor of the present invention was cooled using liquid nitrogen in a 7 T (tesla) external magnetic field. After the magnetic field was removed, the trapped magnetic field distribution on the surface was observed. As shown in FIG. 5A, the trapped magnetic field distribution was able to be confirmed to have a single peak free of the effects of cracks and so forth. In addition, the maximum value of the single peak of the trapped magnetic field was 0.9 T, thereby clearly demonstrating that an extremely high magnetic field could be trapped.

Next, when the trapped magnetic field on the bottom of the same oxide superconductor was observed, as shown in FIG.

5B, the maximum value of the trapped magnetic field was 1.0 T, and it was able to be confirmed that the trapped magnetic field distribution had a single peak and was free of cracks. Thus, an oxide superconductor was confirmed that the superconductor produced has a high trapped magnetic field on both the top and bottom sides.

Figure 6A:
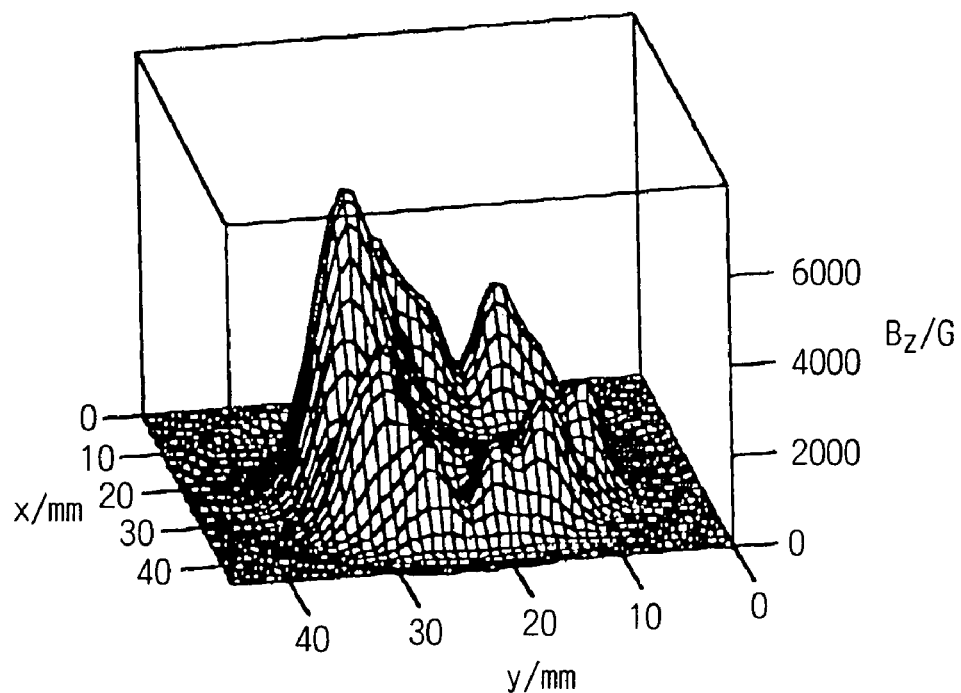
FIG. 6A is a graph showing the trapped magnetic field distribution of a top surface of an oxide superconductor obtained in Examples as a comparative material.
Figure 6B:
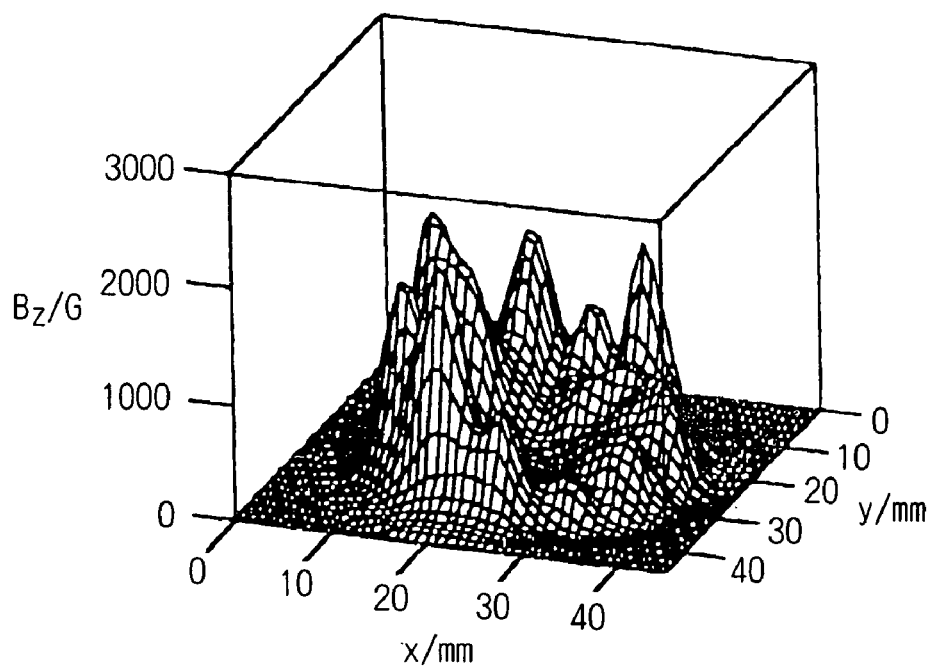
FIG. 6B is a graph showing the trapped magnetic field distribution of a bottom surface of the oxide superconductor obtained in Examples as a comparative material.

On the other hand, the results of the trapped magnetic field distribution measurements on the top and bottom of the oxide superconductor of the comparative material are shown in FIGS. 6A and 6B. The trapped magnetic field decreased due to the effects of cracking. These magnetic field distributions had multiple peaks, and the maximum values of the peaks were low such that a maximum value was 0.4 T on the top surface of the oxide superconductor and a maximum value was 0.2 T on the bottom surface of the oxide superconductor.

Example 3

A pulverized sintered materials having the compositional ratio of $GdBa_2Cu_3O_{7-x}$ (Gd123) and a pulverized oxide having a composition of $Gd_2BaCuO_5$ (Gd211) were weighed so that their blending ratio was 2:1. Moreover, 0.5% by weight of Pt, and 10% by weight of silver oxide ($Ag_2O$) powder used for the purpose of inhibiting variations in mechanical strength of the bulk-shaped oxide superconductor to be produced, were added to obtain a mixture. This mixture was mixed and pulverized for 3 hours in a powder mixing device to obtain a mixed raw material powder.

Uni-axial pressing was carried out on the aforementioned mixed powder of raw materials at a pressure of 1.5 tons to mold into apellet (diameter: 40 mm, thickness: 13 mm). Subsequently, this pellet was subjected to cold isostatic pressing treatment at a pressure of 2 tons/cm² to obtain two precursors.

Next, a $Y_2O_3$ powder layer (intermediate layer) was formed on an alumina ($Al_2O_3$) boat in the same manner as Example 1, a $BaCuO_2$ powder layer (substrate material) was formed thereon, and furthermore, the aforementioned precursor was placed thereon to obtain a sample of the present invention.

In addition, the same $Y_2O_3$ powder layer as that described above was formed on an alumina ($Al_2O_3$) boat, and a mixed powder consisting of a powder having the compositional ratio of $YbBa_2Cu_3O_{7-x}$ (Yb123) and a powder having the compositional ratio of $Yb_2BaCuO_5$ was spread on the layer followed by placing the aforementioned precursor thereon to prepare a comparative material.

These sample and comparative material were placed in an argon gas atmosphere containing 1% oxygen, heated to 1080° C. to put the precursors into a partially molten state, and then held at 1080° C. for 1 hour. Subsequently, the sample and comparative material were cooled to 990° C. over 2 hours, and Nd based seed crystals to which silver oxide had not been added were placed on the top surface of the precursors in the partially molten state followed by cooling to 980° C. over 5 minutes. Next, the sample and comparative material were slowly cooled to 960° C. at the rate of 0.5° C./hour, held for 70 hours at this temperature (960° C.), and then furnace-cooled to obtain disk-shaped oxide superconductors having a diameter of 30 mm and a thickness of 10 mm.

The resulting oxide superconductors were observed. A spontaneously nucleated region at which Yb preferentially reacted with the precursor in partially molten state was confirmed at multiple locations on the bottom of the oxide superconductor of the comparative material, and a plurality of cracks had formed with these portions at which reaction proceeded spontaneously as starting points.

In contrast, a spontaneously nucleated region was unable to be confirmed in the bottom of the sample, and cracks did not form in the oxide superconductor sample of the present invention.

When a trapped magnetic field was measured under the same conditions as Examples 1 and 2, the sample of the present invention was confirmed to demonstrate a trapped magnetic field distribution that had a single peak and was free of the effects of cracks and so forth. In addition, the maximum values of the single peak of the trapped magnetic field was 1.4 T on the top surface side and 1.3 T on the bottom surface side, clearly demonstrating that an extremely high magnetic field was able to be trapped. On the other hand, the trapped magnetic field of an oxide superconductor of the comparative material decreased due to the effects of cracking, the trapped magnetic field distribution had multiple peaks, and the maximum values of the peaks were low such that a maximum value on the top surface side of 0.7 T and a maximum value on the bottom surface side of 0.4 T.

Here, the bulk-shaped oxide superconductor having the composition of $NdBa_2Cu_3O_{7-x}$ (Nd123) that is free of cracks and has a diameter of 30 mm and thickness of 10 mm produced in the aforementioned Example 1 is currently the longest among Nd based oxide superconductor in the world.

In this type of RE-Ba—Cu—O based oxide superconductor, Nd based oxide superconductors are susceptible to cracking in the case of producing it using a partial melting and solidification method, and what is more, cracks easily grow through the entire oxide superconductor once the cracks have formed. Here, even if, for example, a tiny crack forms in the bottom side of a Y based oxide superconductor, the crack rarely passes through the entire oxide superconductor. Because of this characteristic, large, bulk-shaped oxide superconductors of roughly 100 mm diameter have actually been obtained using Y based oxide superconductors.

However, since Nd based oxide superconductors are susceptible to the spreading of cracks accompanying a partially melting and solidification method in particular, it is has been extremely difficult in the prior art to obtain Nd based oxide superconductors which have a single peak and are free of cracks, and have a diameter of larger than 20 mm.

Under these circumstances, the present invention enables the production of a large, bulk-shaped Nd based oxide superconductor having a diameter of 30 mm without the formation of cracks. Moreover, it has been clearly demonstrated that one can obtain oxide superconductors that have superior characteristics in which they demonstrate only a single peak in the trapped magnetic field distribution of samples thereof. The present invention has been shown to demonstrate extremely effective and remarkable effects in the technology for producing large, bulk-shaped oxide superconductors. Furthermore, the defect-free Nd based oxide superconductor having a diameter of 30 mm is currently the largest in the world. The Nd based oxide superconductors which have a diameter of 30 mm or more, and have a superior characteristic of demonstrating only a single peak in a trapped magnetic field distribution, and providing the same characteristics on the top and bottom sides of the superconductor, are currently unable to be achieved by using a technology other than that of the present invention.

As has been described above, according to the present invention, a spontaneously nucleated region is not allowed to occur in a precursor by carrying out a partially melting and solidification method on a partially molten precursor. The partially molten precursor is supported with a substrate material composed of a compound or pure metal that is able to melt in the partially molten precursor. Accordingly, an oxide superconductor can be obtained that is free of the formation of cracks caused by a difference of the thermal expansion coefficients.

INDUSTRIAL APPLICABILITY

In the present invention, when an oxide superconductor is produced by melting and solidification of a precursor which is supported with a substrate material that melts in the precursor but does not contain a rare earth element, a molten and solidified portion that does not contain a rare earth element but contains either or both of Ba and Cu is formed in a portion at which the precursor is supported. If an oxide superconductor having this type of molten solidified portion is produced by a partial melting and solidification method, since a portion at which reaction proceeds spontaneously does not occur in the molten solidified portion, there are no portions having different coefficient of thermal expansion in the resulting oxide superconductor, and a crack-free oxide superconductor is provided in which cracks caused by a difference in the coefficients of thermal expansion do not form during solidification.

If an oxide superconductor is produced by supporting its bottom while melting and solidification, an oxide superconductor can be obtained that has a molten solidified portion which is free of a portion at which reaction proceeds spontaneously in its bottom.

The invention claimed is:

1. A method for producing a rare earth oxide superconductor comprising: placing a precursor of a rare earth oxide superconductor on a substrate material containing pure metal or a compound which is meltable in the precursor when the precursor is partially molten, and producing the oxide superconductor by partial melting and solidifying the precursor in said state; wherein the substrate material contains one or more of pure metal of Ba or Cu; oxides, composite oxides, carbonates, sulfides, sulfates, chlorides, hydroxides and nitrates of Ba and Cu; and noble metals selected from Ag, Au, Pt, Pd and their oxides; but does not contain a rare earth element.

2. The method for producing an oxide superconductor according to claim 1, wherein the substrate material consists of a pure metal or compound which is meltable in the partially molten precursor uniformly, and the pure metal or compound does not provide a portion in the oxide superconductor, where a reaction proceeds spontaneously and stress concentration cracks form resulting from a difference in the coefficients of thermal expansion between the substrate material and the oxide superconductor.

3. The production method of an oxide superconductor according to claim 1, wherein the oxide superconductor is an RE—Ba—Cu—O based oxide superconductor, and the RE represents a rare earth element, and the substrate material is a material that contains Ba or Cu in a molten state but does not contain a rare earth element.

4. The production method of an oxide superconductor according to claim 1, wherein, after placing an intermediate layer containing at least one selected from the group consisting of $Y_2O_3$, $Yb_2O_3$, $Er_2O_3$, $Ho_2O_3$, $Dy_2O_3$, $Eu_2O_3$, $Sm_2O_3$, $Gd_2O_3$, $ZrO_2$, $Al_2O_3$, $BaZrO_3$, MgO and yttrium stabilized zirconia on a mount made of a heat-resistant material, the substrate material is placed on the intermediate layer, and the precursor of the oxide superconductor is placed on the substrate material for conducting partial melting and solidification of the precursor.

5. The production method of an oxide superconductor according to claim 1, wherein the substrate material contains at least one selected from the group consisting of a pure metal of Ba or Cu, oxides, composite oxides, carbonates, sulfides, sulfates, chlorides, hydroxides and nitrates of Ba or Cu.

6. The production method of an oxide superconductor according to claim 5, wherein the oxide, composite oxide, carbonate, sulfide, sulfate, chloride, hydroxide or nitrate of Ba or Cu is BaO, CuO, $Cu_2O$, $BaCuO_2$, $BaCO_3$, $CuCO_3$, BaS, CuS, $BaSO_4$, $CuSO_4$, $BaCl_2$, CuCl, $CuCl_2$, $Ba(OH)_2$, $Cu(OH)_2$, $Ba(NO_3)_2$ or $Cu(NO_3)_2$.

7. The production method of an oxide superconductor according to any one of claims 3 to 6, wherein the substrate material comprises at least one selected from noble metals including Ag, Au, Pt and Pd and their oxides.

8. An RE-Ba—Cu—O based oxide superconductor, wherein RE represents a rare earth element, and where the oxide superconductor comprises a portion solidified after melting and exposed to the outside, wherein the solidified portion contains one of or both of Ba and Cu but does not contain a rare earth element and the solidified portion is generated from a molten reaction between a precursor of the RE-Ba—Cu—O superconductor and a substrate material which is used for supporting the precursor when the precursor is melted and solidified;
wherein the substrate material contains one or more of a pure metal of Ba or Cu; oxides, composite oxides, carbonates, sulfides, sufates, chlorides, hydroxides and nitrates of Ba and Cu; and noble metals selected from Ag, Au, Pt and Pd and their oxides; but does not contain a rare earth element.

9. The oxide superconductor according to claim 8, wherein at least one selected from noble metals including Ag, Au, Pt and Pd is additionally contained in the solidified portion.

10. The oxide superconductor according to claim 8, wherein the solidified portion is formed in a bottom of the oxide superconductor where the precursor contacts the substrate material when the precursor is melted and solidified.

11. The oxide superconductor according to any of claims 8 to 10, wherein the trapped magnetic field distribution of a top surface of the oxide superconductor is the same as the trapped magnetic field distribution of a bottom surface of the oxide superconductor where the substrate material contacts the precursor when the precursor is melted and solidified.

12. The oxide superconductor according to claim 8, wherein the oxide superconductor is produced by the method comprising:
placing a precursor of an oxide superconductor on a substrate material containing pure metal or a compound which is meltable in the precursor when the precursor is partially molten, and producing the oxide superconductor by partial melting and solidifying the precursor in said state;
wherein the oxide superconductor further comprises a portion solidified after melting and exposed to the outside, and the solidified portion is not an oxide superconductor.

13. The production method of an oxide superconductor according to claim 1, wherein the precursor of an oxide superconductor is a compact of a mixture of raw materials, and the mixture of raw materials has the same or a similar composition as a composition of the oxide superconductor.

14. The production method of an oxide superconductor according to claim 1, wherein the substrate material is not a superconductor.

15. The method for producing an oxide superconductor according to claim 1, wherein the precursor is not superconductive.

16. The oxide superconductor according to claim 8, wherein the precursor is not superconductive.

* * * * *

UNITED STATES PATENT AND TRADEMARK OFFICE
CERTIFICATE OF CORRECTION

| | | |
|---|---|---|
| PATENT NO. | : 7,718,573 B2 | Page 1 of 1 |
| APPLICATION NO. | : 10/543162 | |
| DATED | : May 18, 2010 | |
| INVENTOR(S) | : Motohide Matsui | |

It is certified that error appears in the above-identified patent and that said Letters Patent is hereby corrected as shown below:

Title page, item (*) Notice: should read as follows:

Subject to any disclaimer, the term of this patent is extended or adjusted under 35 U.S.C. 154(b) by 527 days.

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,718,573 B2
APPLICATION NO. : 10/543162
DATED : May 18, 2010
INVENTOR(S) : Motohide Matsui et al.

It is certified that error appears in the above-identified patent and that said Letters Patent is hereby corrected as shown below:

This certificate supersedes the Certificate of Correction issued June 15, 2010. The Certificate of Correction is vacated since no change to patent term adjustment has been granted. The [*] Notice should read as follows:
--Subject to any disclaimer, the term of this patent is extended or adjusted under 35 U.S.C. 154(b) by 888 days.--

Signed and Sealed this

Fourteenth Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,718,573 B2
APPLICATION NO. : 10/543162
DATED : May 18, 2010
INVENTOR(S) : Motohide Matsui and Masato Murakami It is certified that error appears in the above-identified patent and that said Letters Patent is hereby corrected as shown below:

On the title page, item (73), "Origin Electric Company, Ltd, Tokyo (JP)" should be
-- International Superconductivity Technology Center, The Juridical Foundation, Tokyo (JP) and Railway Technical Research Institute, Tokyo (JP) --.

Signed and Sealed this

Fifth Day of October, 2010

David J. Kappos
*Director of the United States Patent and Trademark Office*